(12) United States Patent
Willassen et al.

(10) Patent No.: US 7,541,871 B2
(45) Date of Patent: Jun. 2, 2009

(54) OPERATIONAL TRANSCONDUCTANCE AMPLIFIER (OTA)

(75) Inventors: Trygve Willassen, Oppegard (NO); Tore Martinussen, Oslo (NO)

(73) Assignee: Micron Technology, Inc., Boise, ID (US)

( * ) Notice: Subject to any disclaimer, the term of this patent is extended or adjusted under 35 U.S.C. 154(b) by 82 days.

(21) Appl. No.: 11/743,503

(22) Filed: May 2, 2007

(65) Prior Publication Data

US 2008/0272845 A1 Nov. 6, 2008

(51) Int. Cl.
*H03F 3/45* (2006.01)
(52) U.S. Cl. ...................................... 330/257; 323/315
(58) Field of Classification Search ................. 330/257, 330/253; 323/315, 312
See application file for complete search history.

(56) References Cited

U.S. PATENT DOCUMENTS

| | | | |
|---|---|---|---|
| 5,412,343 A | 5/1995 | Rijns | |
| 5,729,178 A | 3/1998 | Park et al. | |
| 5,966,005 A * | 10/1999 | Fujimori | ............ 323/315 |
| 6,052,025 A | 4/2000 | Chang et al. | |
| 6,169,456 B1 | 1/2001 | Pauls | |
| 6,211,659 B1 | 4/2001 | Singh | |
| 7,038,538 B2 | 5/2006 | Tran et al. | |
| 2004/0263251 A1 | 12/2004 | Sugimura | |
| 2006/0139096 A1 | 6/2006 | Zolfaghari | |
| 2006/0226893 A1 | 10/2006 | Abel | |

FOREIGN PATENT DOCUMENTS

| | | |
|---|---|---|
| EP | 0613072 A1 | 8/1994 |
| EP | 0643347 A1 | 3/1995 |
| EP | 1081573 A1 | 3/2001 |
| JP | 11-150430 | 6/1999 |
| WO | WO 95/13653 A1 | 5/1995 |
| WO | WO 01/69681 A1 | 9/2001 |
| WO | WO 03/019771 A1 | 3/2003 |

OTHER PUBLICATIONS

Harjani, et al.; An Integrated Low-Voltage Class AB CMOS OTA; IEEE (Institute of Electrical and Electronics Engineers) Journal of Solid-State Circuits; Feb. 1999; pp. 134-142; vol. 34. No. 2; IEEE (Institute of Electrical and Electronics Engineers).

Castello, et al.; A 500-nA Sixth-Order Bandpass SC Filter; IEEE (Institute of Electrical and Electronics Engineers) Journal of Solid-State Circuits; Jun. 1990; pp. 669-676; vol. 25. No. 3; IEEE (Institute of Electrical and Electronics Engineers).

(Continued)

*Primary Examiner*—Robert Pascal
*Assistant Examiner*—Hieu P Nguyen
(74) *Attorney, Agent, or Firm*—Knobbe Martens Olson & Bear LLP

(57) ABSTRACT

Apparatus and methods provide an operational transconductance amplifier (OTA) with one or more self-biased cascode current mirrors. Applicable topologies include a current-mirror OTA and a folded-cascode OTA. In one embodiment, the self-biasing cascode current mirror is an optional aspect of the folded-cascode OTA. The self-biasing can advantageous reduce the number of biasing circuits used, which can save chip area and cost. One embodiment includes an input differential pair of a current-mirror OTA.

5 Claims, 3 Drawing Sheets

OTHER PUBLICATIONS

Tsividis, et al.; A Process-Insensitive High-Performance NMOS Operational Amplifier; IEEE (Institute of Electrical and Electronics Engineers) Journal of Solid-State Circuits; Dec. 1980; pp. 921-928; vol. SC-15, No. 6; IEEE (Institute of Electrical and Electronics Engineers).

Dessent, et al.; A Two-Stage Fully Differential Operational Transconductance Amplifier; EE240 Term Project Report; Spring 2001; University of California, Berkeley.

Lars Wanhammer; Comparison of Three Operational Transconductance Amplifiers; [online] [retrieved on Mar. 1, 2007] Retrieved from the Internet: <URL: www.tde.isy.liu.se/projects/AnalogCAD/design_cases/design_space_exploration/3_amplifiers.html>.

Lu, et al.; A CMOS Low-Voltage, High-Gain Op-Amp; European Design and Test Conference, 1997. ED&TC 97. Proceedings; Mar. 17-20, 2007; pp. 51-55; IEEE (Institute of Electrical and Electronics Engineers).

Lu, et al.; A CMOS Op Amp Using a Regulated-Cascode Transimpedance Building Block for High-Gain, Low-Voltage Achievement; 1997 IEEE (Institute of Electrical and Electronics Engineers) International Symposium on Circuits and Systems; Jun. 9-12, 1997; pp. 165-168; IEEE (Institute of Electrical and Electronics Engineers).

Mandal, et al; Active Biasing of Multistage CMOS Op-Amps for Performance Enhancement; International Journal of Electronics; 1999; pp. 933-946; vol. 86, No. 8; Taylor & Francis Ltd.

* cited by examiner

OPERATIONAL TRANSCONDUCTANCE AMPLIFIER (OTA)

BACKGROUND

1. Field of the Invention

Embodiments of the invention generally relate to electronics. In particular, embodiments of the invention relate to analog integrated circuits.

2. Description of the Related Art

Analog amplifiers are widely use in electronic devices. Applications include, but are not limited to: buffers, attenuators, gain amplifiers, current amplifiers, filters, drivers, interface circuits between digital and analog domains, and the like. One type of amplifier is known as an operational transconductance amplifier (OTA). An OTA receives a differential input voltage and generates an output current. OTAs are commonly used in, for example, variable frequency oscillators, filters, variable gain amplifiers, and the like.

It is desirable for an analog amplifier to have relatively good performance, to be inexpensive to manufacture, to be usable in a wide range of power supply voltages, to be able to swing relatively large output voltages, and the like. For example, in a mobile battery-powered application with a relatively low-voltage power supply, analog amplifiers preferably efficiently utilize the available supply voltage.

In the context of a switched-capacitor filter, an operational transconductance amplifier (OTA) is described by Rinaldo Castello, et al., in "A 500-nA Sixth-Order Bandpass SC Filter," IEEE JOURNAL OF SOLID-STATE CIRCUITS, Vol. 25, No. 3, June 1990, pp. 669-676. However, the application of the foregoing amplifier appears to be prone to relatively severe mismatches for the drain-to-source voltages of the mirror transistors. For example, with reference to Castello, ibid, the drain-to-source voltages for the following three current mirrors: M7/M9, M8/M11 and M13/M15 all appear to be mismatched.

BRIEF DESCRIPTION OF THE DRAWINGS

The drawings and the associated description herein are provided to illustrate specific embodiments of the invention and are not intended to be limiting.

DETAILED DESCRIPTION OF EMBODIMENTS

Circuit topologies are disclosed that provide an operational transconductance amplifier (OTA) with one or more self-biased cascode current mirrors. Applicable topologies include a current-mirror OTA and a folded-cascode OTA. An OTA is found in many analog circuits. Applications include, but are not limited to: buffers, attenuators, gain amplifiers, current amplifiers, filters, drivers, sensors, interface circuits between digital and analog domains, and the like.

One advantage of the self-biased cascode current mirror is that it saves extra bias voltages from having to be provided. This advantageously reduces power consumption, size, and cost. Although particular embodiments are described herein, other embodiments of the invention, including embodiments that do not provide all of the benefits and features set forth herein, will be apparent to those of ordinary skill in the art. For example, while the self-biased cascode current mirror is illustrated in the examples implemented in NMOS, the principles and advantages described herein are also applicable to PMOS.

Figure 1:
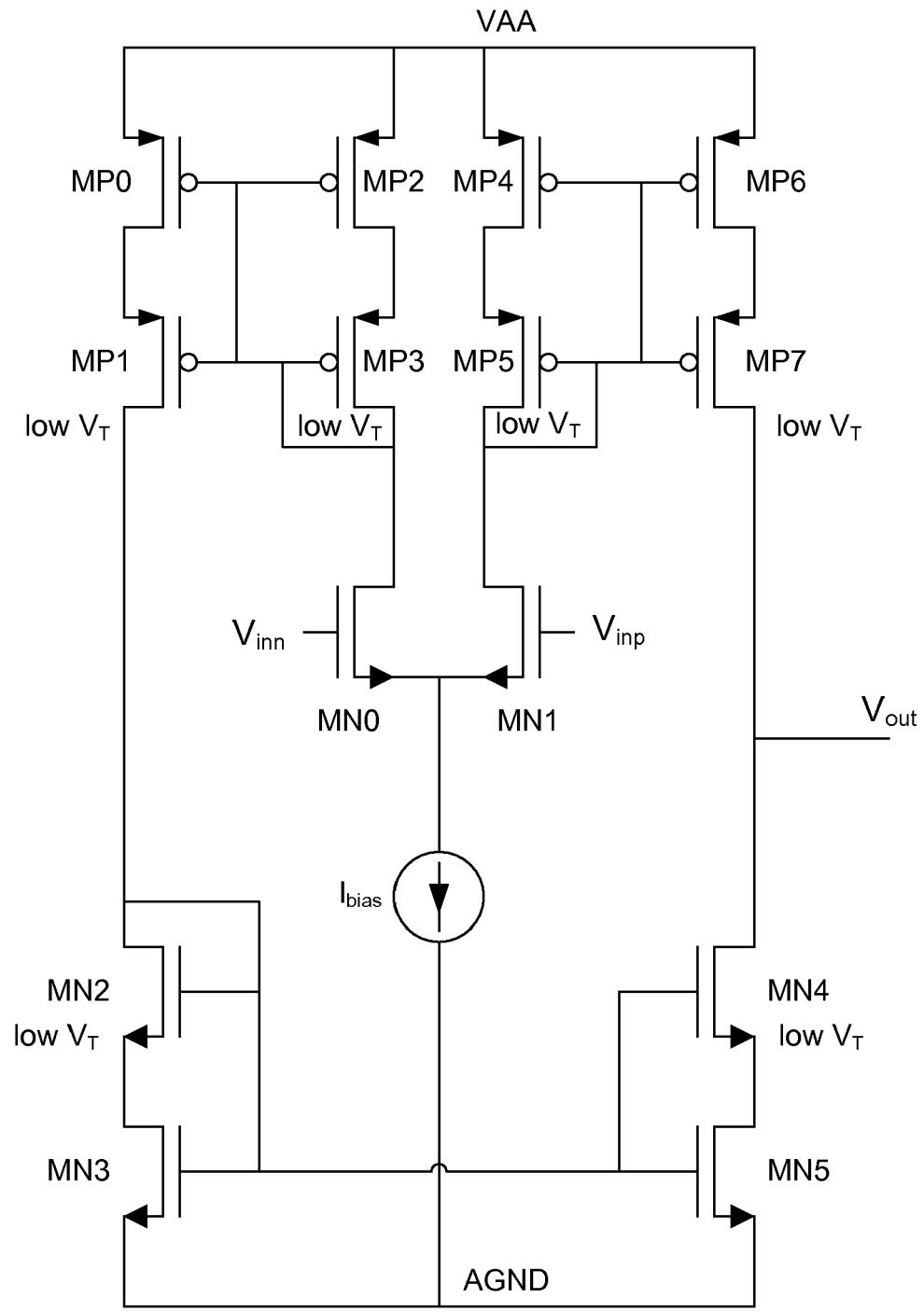
FIG. 1 is a schematic generally illustrating a current-mirror (symmetrical) operational transconductance amplifier with self-biased cascode current mirrors.

FIG. 1 is a schematic generally illustrating a current-mirror (symmetrical) operational transconductance amplifier with self-biased cascode current mirror circuits. In the illustrated embodiment, all three of the cascode current mirror circuits are self biased. However, in an alternative embodiment, fewer than all of the cascode current mirror circuits are self biased.

In FIG. 1, VAA and AGND indicates voltage references, e.g., a positive voltage for FAA and analog ground for AGND. Transistors MN0 and MN1 form a differential input circuit. Transistors MP0-MP3, MP4-MP7, and MN2-MN5 form self-biased cascode current mirror circuits. A current reference $I_{bias}$ biases the differential input circuit. For example the current reference $I_{bias}$ can be embodied by a drain terminal of a transistor having a voltage-biased gate terminal. For the purposes of illustration, the transistors will be described as having the same size or width-to-length ratio (W/L). However, it will be understood that scaled devices can be used and that with respect to current-mirroring, mirrored currents typically scale in proportion with the scaling of the transistors.

In the illustrated examples, the cascode transistors MP1, MP3, MP5, MP7, MN2, and MN4 have a lower threshold voltage than the mirror transistors MP0, MP2, MP4, MP6, MN3, and MN5. This permits the gate terminals of each of the transistors of the cascode current mirror circuits to be tied together and obviates the need for a biasing circuit specifically for the cascode transistors and avoids an undesirable offset as found in Castello's implementation.

Operation of the current-mirror operational transconductance amplifier will now be described. A gate terminal of transistor MN1 is coupled to a non-inverting input $V_{inp}$. A gate terminal of transistor MN0 is coupled to an inverting input $V_{inn}$. Source terminals of transistors MN0 and MN1 are coupled to each other and to the current reference $I_{bias}$.

The operation of the self-biased cascode current mirror circuit of transistors MP4-MP7 will now be described. The other self-biased cascode current mirror circuits (MP0-MP3 and MN2-MN5) operate in the same manner. Transistors MP4 and MP5 form a reference portion of the self-biased cascode current mirror circuit. Transistors MP6 and MP7 form a mirror portion of the self-biased cascode current mirror circuit. Transistors MP5 and MP7 are cascode transistors. Transistors MP4 and MP6 are mirror transistors.

The drain current of transistor MN1 also flows through transistors MP4 and MP5. The current establishes a gate-to-source voltage across transistor MP4, which is applied as a gate-to-source control voltage across transistor MP6 so that the current of transistor MP6 mirrors the current of transistor MP4. Due to the series connection, the current of transistor MP7 is the same as the current of transistor MP6. The resulting current flowing out of the drain terminal of transistor MP7 then mirrors the current flowing out of the drain terminal of transistor MP5 and into the drain terminal of transistor MN1. It will be understood that transistors MP6 and MP7 can be scaled relative to transistors MP4 and MP5, and that if scaled, the current will typically similarly scale. The use of the term "mirror" herein does not imply that the scaling is necessarily 1:1. The mirrored current from transistor MP7 provides current to the output node $V_{out}$.

The inequality expressed in Equation 1 should be satisfied to bias the self-biased cascode current mirror circuit in the desirable saturation region for analog operation.

$$(|V_{GS\_MIRR}|-|V_{GS\_CASC}|)=|V_{DS\_MIRR}|>|V_{DSAT\_MIRR}| \qquad \text{Eq. 1}$$

In Equation 1, $V_{GS\_CASC}$ is the gate-to-source voltage for a cascode transistor (e.g., transistor MP5); $V_{GS\_MIRR}$ is the gate-to-source voltage for a mirror transistor (e.g., transistor MP4); $V_{DS\_MIRR}$ is the drain-to-source voltage for a mirror transistor; and $V_{DSAT\_MIRR}$ is drain-to-source saturation voltage for a mirror transistor.

The self-biased cascode current mirror circuit of transistors MP0-MP3 generates a mirror current flowing out of the drain terminal of transistor MP1 that is a mirror of the current flowing into the drain terminal of transistor MN0. The mirrored current from the drain terminal of transistor MP1 flows into the drain terminal of transistor MN2 of the self-biased cascode current mirror circuit of transistors MN2-MN5. The mirrored current from transistor MP1 flows through transistors MN2 and MN3. The self-biased cascode current mirror circuit of transistors MN2-MN5 generates a mirror current flowing into the drain terminal of transistor MN4 and through transistors MN4 and MN5. This mirror current sinks current from the output node $V_{out}$.

Figure 2:
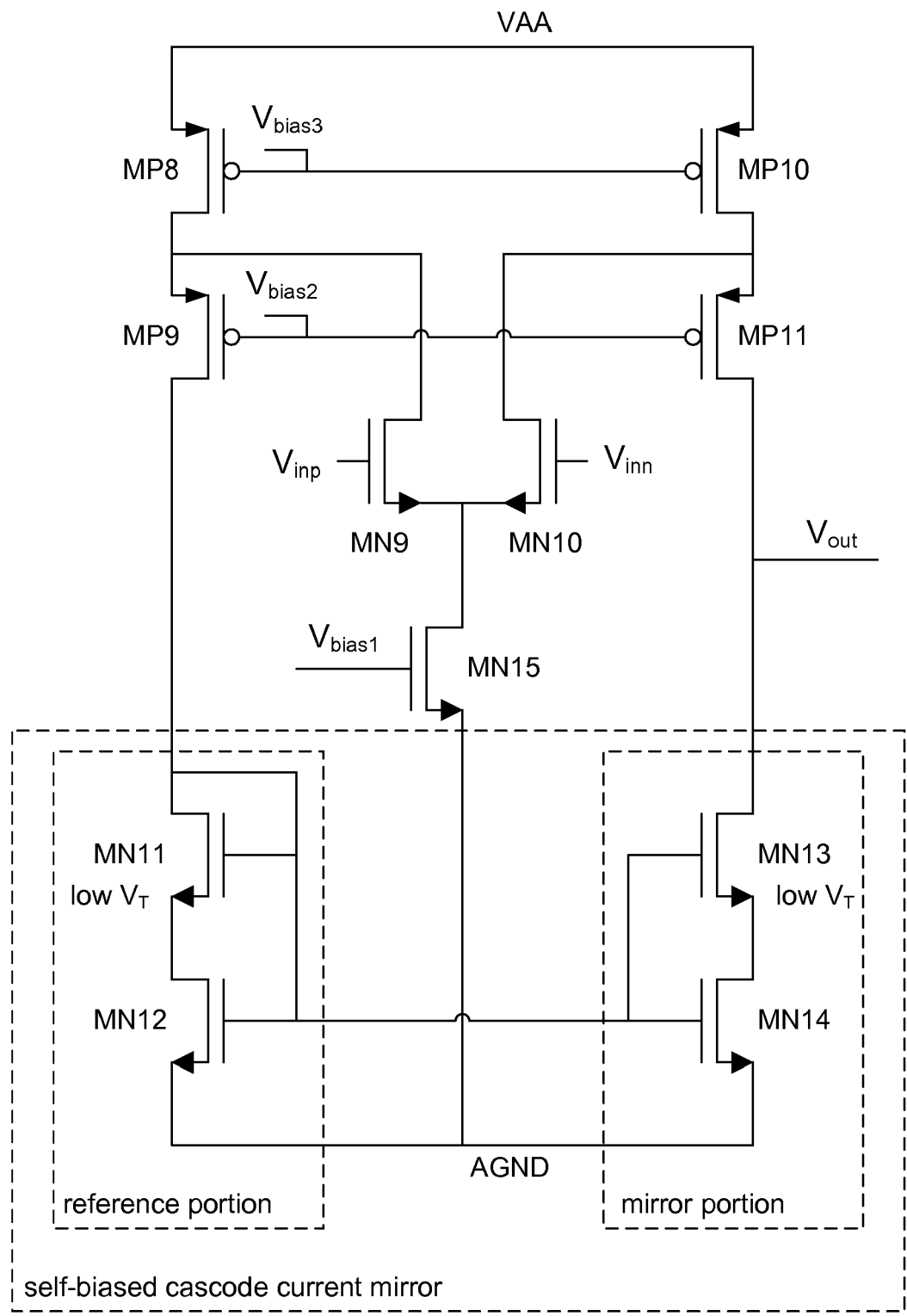
FIG. 2 is a schematic generally illustrating a folded-cascode operational transconductance amplifier with self-biased cascode current mirrors.
Figure 3:
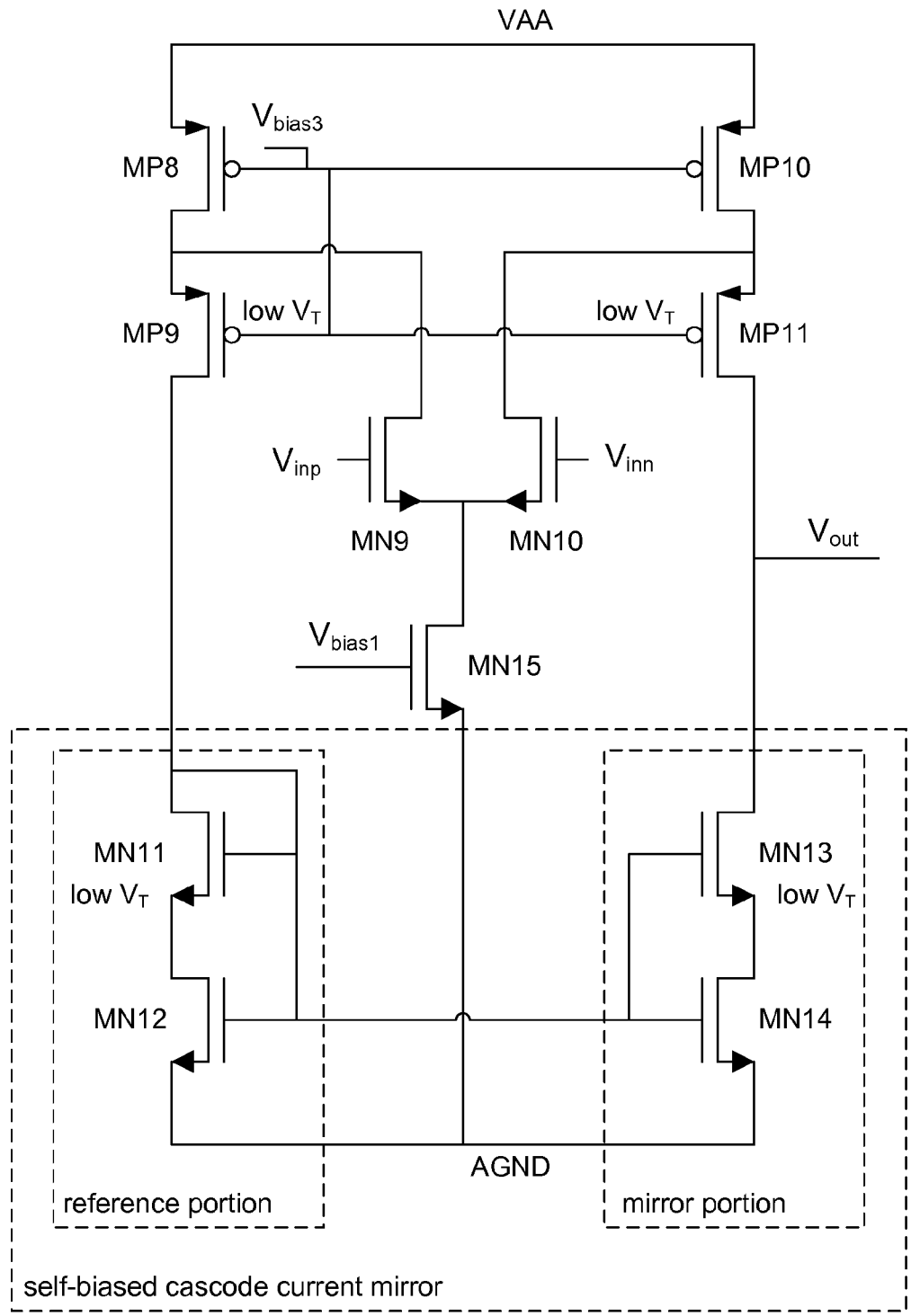
FIG. 3 is a schematic generally illustrating a folded-cascode operational transconductance amplifier with additional low-threshold voltage transistors.

FIGS. 2 and 3 are schematics generally illustrating a folded-cascode operational transconductance amplifier with self-biased cascode current mirrors. Transistors MN9 and MN10 form a differential input circuit. Transistor MN15 forms a current source (sink) that biases the differential input circuit. Transistors MP8-MP11 form fixed and variable current references. Transistors MN11-MN14 form a self-biased cascode current mirror.

A gate terminal of transistor MN15 is coupled to a bias voltage $V_{bias1}$. In the illustrated embodiment of FIG. 2, gate terminals of transistors MP9 and MP11 are coupled to a bias voltage $V_{bias2}$, and gate terminals of transistors MP8 and MP10 are coupled to a bias voltage $V_{bias3}$. In an alternative embodiment illustrated in FIG. 3, transistors MP9 and MP11 have a lower threshold voltage than transistors MP8 and MP10, and the bias voltage $V_{bias2}$ is not needed, further reducing the number of voltage biases used. In one embodiment, the self-biasing feature of the cascode current mirror circuit for the embodiment of FIG. 3 is optional, e.g., a conventional cascode current mirror circuit can be used. A source terminal of transistor MN15 is coupled to a voltage reference (AGND). The drain terminal of transistor MN15 is coupled to source terminals of transistors MN9 and MN10 of the differential input circuit.

A gate terminal of transistor MN10 is coupled to an inverting input $V_{inn}$, and a gate terminal of transistor MN9 is coupled to a non-inverting input $V_{inp}$.

A drain terminal of transistor MN10 is coupled to a drain terminal of transistor MP10 and to a source terminal of transistor MP11. A drain terminal of transistor MN9 is coupled to a drain terminal of transistor MP8 and to a source terminal of transistor MP9. Source terminals of transistors MP8 and MP10 are coupled to a voltage reference (VAA). A drain terminal of transistor MP11 is coupled to an output node $V_{out}$. A drain terminal of transistor MP9 is coupled to the drain terminal of transistor MN11 of the self-biased cascode current mirror circuit.

Transistors MN11 and MN13 of the self-biased cascode current mirror circuit have a lower-threshold voltage than transistors MN12 and MN14. The drain terminal of transistor MN11 is coupled to the gate terminals of transistors MN11-MN14. The source terminal of transistor MN11 is coupled to the drain terminal of transistor MN12. The source terminals of transistors MN12 and MN14 are coupled to a voltage reference (AGND). The drain terminal of transistor MN14 is coupled to the source terminal of transistor MN13. The drain terminal of transistor MN13 is coupled to the output node $V_{out}$.

The folded cascode OTA circuit generally operates as follows. For the purposes of explanation, current flow due to parasitic capacitance at high speeds is ignored. Transistors MP8 and MP10 generate relatively constant currents at their drain terminals. With respect to transistor MP10, a portion of the current from the drain terminal of transistor MP10 flows through the drain terminal of transistor MN10 and another portion flows through the source terminal of transistor MP11. The differential input voltage $V_{inp}$, $V_{inn}$ determines how the current from transistor MP10 is allocated between transistor MN10 and transistor MP11. The current flowing from the drain terminal of transistor MP11 flows into the output node $V_{out}$.

Similarly, the current flowing from the drain terminal of transistor MP9 flows into the drain terminal of transistor MN11. The same current flowing through transistor MN11 flows through transistor MN12. The gate-to-source voltage of transistor MN14 is the same as the gate-to-source voltage of transistor MN12, and the current through transistors MN13 and MN14 should then mirror the current flowing through transistors MN11 and MN12, which in turn, mirror the current flowing through transistor MP9. The drain terminal of transistor MN13 is coupled to the output node $V_{out}$ to sink current from that node.

Various embodiments have been described above. Although described with reference to these specific embodiments, the descriptions are intended to be illustrative and are not intended to be limiting. Various modifications and applications may occur to those skilled in the art without departing from the true spirit and scope of the invention as defined in the appended claims.

We claim:

1. An apparatus for amplifying a signal, the apparatus comprising:

a differential input circuit with at least a first transistor having a gate terminal, a source terminal, and a drain terminal, wherein the gate terminal of the first transistor is coupled to a terminal for a non-inverting input and a second transistor having a gate terminal, a source terminal, and a drain terminal, wherein the gate terminal of the second transistor is coupled to a terminal for an inverting input, wherein the source terminal of the first transistor and the source terminal of the second transistor are coupled to each other;

a first cascode current mirror circuit operatively coupled to the drain terminal of the first transistor and configured to pass a drain current of the first transistor, wherein the first cascode current mirror circuit is configured to generate a first mirrored current of the drain current of the first transistor and for a first node, wherein the first node is coupled to an output terminal;

a second cascode current mirror circuit operatively coupled to the drain terminal of the second transistor and is configured to pass a drain current of the second transistor, wherein the second cascode current mirror circuit is configured to generate a second mirrored current of the drain current of the second transistor and for a second node; and a third cascode current mirror circuit coupled to the first node and to the second node, wherein the third cascode current mirror circuit is configured to pass the second mirrored current of the second cascode current mirror circuit, wherein the third cascode current mirror circuit is configured to generate a third mirrored current of the second mirrored current of the second cascode current mirror circuit, wherein the third mirrored current is for the first node;

wherein at least one of the first cascode current mirror circuit, the second cascode current mirror circuit, or the third cascode current mirror circuit has two transistors of a first voltage threshold and two transistors of a second voltage threshold higher than the first voltage threshold, wherein gates terminals of the transistors of the at least one cascode current mirror circuit are operatively coupled to each other.

2. The apparatus of claim 1, wherein the apparatus comprises a current-mirror operational transconductance amplifier.

3. The apparatus of claim 1, wherein the apparatus comprises a folded-cascode operational transconductance amplifier.

4. The apparatus of claim 1, wherein the transistors of the differential input circuit and the third cascode current mirror circuit comprise NMOS, and the transistors of the first cascode current mirror circuit and the second cascode current mirror circuit comprise PMOS.

5. The apparatus of claim 1, wherein the transistors of the differential input circuit and the third cascode current mirror circuit comprise PMOS, and the transistors of the first cascode current mirror circuit and the second cascode current mirror circuit comprise NMOS.

* * * * *